Nov. 6, 1951 J. J. MURRAY, JR 2,574,188

TUNING FORK STRUCTURE

Filed Aug. 15, 1950 3 Sheets-Sheet 1

INVENTOR.
JOSEPH J. MURRAY, JR.
BY Walter J. Jagmin
ATTORNEY

Nov. 6, 1951 J. J. MURRAY, JR 2,574,188

TUNING FORK STRUCTURE

Filed Aug. 15, 1950 3 Sheets-Sheet 2

INVENTOR.
JOSEPH J. MURRAY, JR.
BY
ATTORNEY

INVENTOR.
JOSEPH J. MURRAY, JR.
BY Walter J. Jagmin
ATTORNEY

UNITED STATES PATENT OFFICE 2,574,188

TUNING FORK STRUCTURE

Joseph J. Murray, Jr., Garland, Tex., assignor to Varo Mfg. Co., Inc., Garland, Tex., a corporation of Texas Application August 15, 1950, Serial No. 179,467

8 Claims. (Cl. 171—209)

This invention relates to mechanical vibrating devices and more particularly to tuning forks.

This application is a continuation in part of my application filed February 11, 1950, Serial No. 143,661.

In many applications a mechanical vibrating device, such as a tuning fork, is employed as a frequency standard. The tuning fork must therefore be provided with a frequency setting device by means of which the frequency of vibration of the tuning fork may be set at a predetermined value. Since frequency of vibration of the tuning fork tends to vary with changes in temperature, means must be provided for maintaining the temperature of the tuning fork substantially constant. The tuning fork and its associated structures must be of compact design since the tuning fork is often employed in portable or airborne equipment.

Accordingly, it is an object of my invention to provide a new and improved tuning fork. It is another object of my invention to provide a new and improved tuning fork mounting structure.

It is another object of my invention to provide a new and improved tuning fork having a frequency setting device.

It is still another object of my invention to provide a new and improved tuning fork structure of compact design.

Briefly stated, my new and improved tuning fork structure comprises a U-shaped supporting means including a pair of substantially U-shaped supporting members rigidly secured together in parallel spaced relation. A tuning fork and its electro-magnetic driving and pick up means are held between the U-shaped members. The free ends of each U-shaped member are secured to each other by a flat connecting member. The flat members are tensioned by means of a screw which draws the middle portions of the flat connecting members toward each other and therefore draws the free ends of the supporting members toward each other. Rotation of the screw changes the tension on the flat members and varies the distance of the electro-magnetic driving and pick-up means from the tuning fork to vary the frequency of vibration of the tuning fork. In order to maintain the temperature of the tuning fork substantially constant, the U-shaped members and the structures supported by the U-shaped members are enclosed in an inner container which is surrounded by a heating coil. A thermostat, also supported on the U-shaped members, controls the energization of the heating coil. The inner container is telescoped in an outer container and the space between the two containers is filled with a heat insulating material.

For a better understanding of my invention reference may be had to the following specification taken in connection with the accompanying drawing and its scope will be pointed out in the appended claims.

Figure 2:
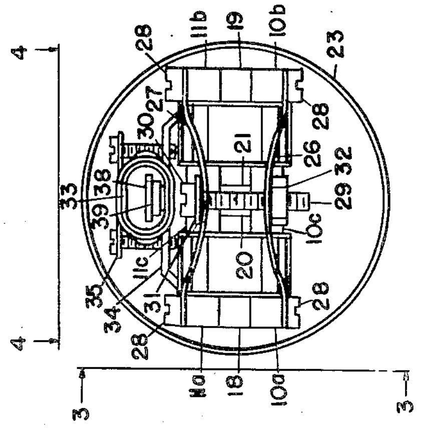
Figure 2 is a top plan view of the device of Figure 1 with some parts removed.
Figure 1:
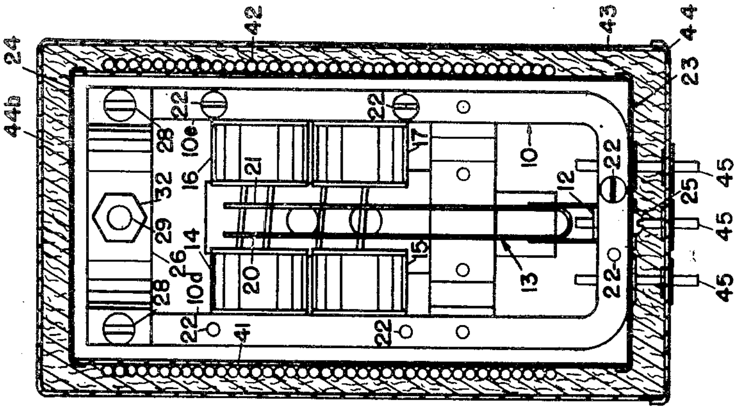
Figure 1 is a partly sectional view of a preferred embodiment of my invention.
Figure 3:
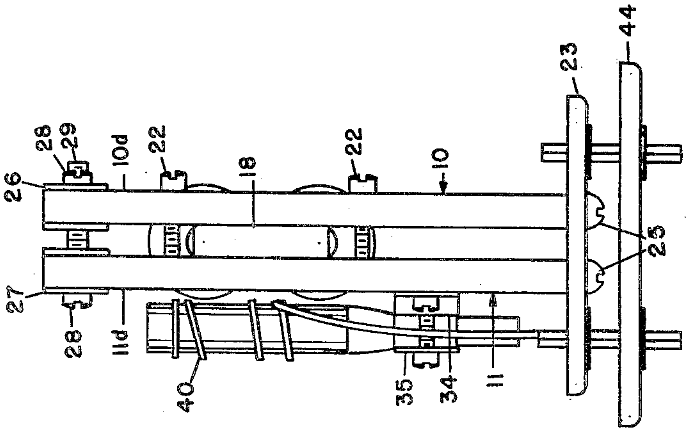
Figure 3 is a side view taken along line 3—3 of Figure 2.
Figure 4:
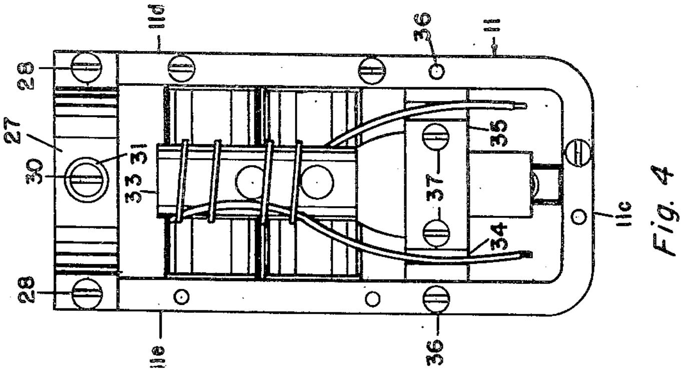
Figure 4 is a side view taken along line 4—4 of Figure 2.

Referring now especially to Figures 1 to 4 of the drawing, the preferred embodiment of my invention illustrated in the drawing comprises a U-shaped supporting means including a pair of U-shaped supporting members 10 and 11 having free upper ends 10*a* and 10*b* and 11*a* and 11*b*, respectively. The base 12 of a tuning fork 13 is disposed between the flat bottom portions 10*c* and 11*c* of supporting members 10 and 11, respectively. Driving coils 14 and 15 and pick-up coils 16 and 17 are disposed on cores 18 and 19, respectively. Cores 18 and 19 are secured between supporting members 10 and 11 on opposite sides of the tines 20 and 21 of tuning fork 13. While I have shown a driving means on one side of tuning fork 13 and a pick-up means on its other side, it will be well understood by those skilled in the art that both a pick-up means and a driving means may be employed on each side of tuning fork 13.

Supporting members 10 and 11 are secured to each other by screws 22 which engage in tapped holes provided in members 10 and 11. Since base 12 of tuning fork 13 and cores 18 and 19 are disposed between members 10 and 11, they are held rigidly in position when screws 20 are rotated to bring supporting members 10 and 11 close to each other. Supporting members 10 and 11 are secured to the base 23 of inner container 24 by any suitable means, such as screws 25.

In order to set the frequency of vibration of tines 20 and 21 at a predetermined value, I provide adjusting means for varying the distances between cores 18 and 19 and tines 20 and 21, respectively. It is found that as the distances between cores 18 and 19 and tines 20 and 21, respectively, decrease, the frequency of vibration of tines 11 and 12 also decreases and vice versa. Since core 18 is secured between the vertical portions 10d and 11d of supporting members 10 and 11, respectively, and core 19 is secured by the opposite upright portions 10e and 11e, the distance between cores 18 and 19 and tines 20 and 21 can be varied by bending upright members 10d, 10e, 11d and 11e inwardly or outwardly as desired. A pair of flat connecting members 26 and 27 connect the free upper ends 10a and 10b and 11a and 11b, respectively, of supporting members 10 and 11. Connecting members 26 and 27 are secured to supporting members 10 and 11 by any suitable means, such as screws 28. An adjusting screw 29 extends through connecting members 26 and 27. Its head 30 abuts a washer 31 which contacts connecting member 27 while its nut 32 is threaded on screw 29 and contacts connecting member 26. Connecting members 26 and 27 lie between head 30 and nut 32 so that when screw 29 is rotated in one direction connecting members 26 and 27 are drawn toward each other which in turn causes upright members 10d and 102 and 11d and 112 to be drawn toward each other, respectively. Since cores 18 and 19 move with upright members 10d and 11d and 10e and 11e, respectively, they approach tines 20 and 21 decreasing the frequency of vibration of tuning fork 13. If screw 29 is rotated in the opposite direction, connecting members 26 and 27 are allowed to move away from each other, the distances between cores 18 and 19 and tines 20 and 21, respectively, is increased and the frequency of vibration of tuning fork 3 is also increased. Upright members 10d, 10e, 11d and 11e and connecting members 26 and 27 are normally under tension so that members 10d and 11d will move away from members 11d and 11e, respectively, whenever connecting member 26 and 27 are given freedom to move away from each other. Nut 32 may be secured to connecting member 26 by any suitable means to prevent turning of nut 32 when screw 29 is turned.

Connecting members 26 and 27 are preferably made of resilient metal strips while supporting members 10 and 11 are preferably of nonmagnetic material such as brass.

A thermostat 33 is mounted on supporting member 11 by means of strips 34 and 35. Strip 34 is secured to supporting member 11 by screws 36 while strip 35 is secured to strip 34 by means of screws 37. The lower end of thermostat 33 is held rigidly between strips 34 and 35. Thermostat 33 may be of the conventional type having a bimetallic strip 38 which contacts a terminal 39 when the temperature falls below a predetermined value. A booster heating coil 40 is wound about thermostat 33 whose function will be described below.

An inner metal container 41 having an open end which is closed by base 23 encloses supporting members 10 and 11 and their associated structures. Inner container 41 is provided with an opening, not shown, adjacent head 30 of screw 29 which permits a screw driver to be inserted within container 41 to adjust screw 29 without removing container 41 from its position about supporting members 10 and 11 and their associated structures.

A main heating coil 42 is disposed about and contacts inner container 41 which, when energized, heats the inner container 41 and all structures located within container 41. Container 41 and heating coil 42 are disposed within a large outer container 43 which is spaced from inner container 41 at all points. The open end of outer container 43 is closed by a base 44. The space between containers 41 and 43 and between bases 23 and 44 is filled with a heat insulating material, e. g. rock wool, to prevent external conditions of temperature from affecting the temperature within inner container 41.

The electrical leads to the heater coils 40 and 41 and coils 14, 15, 16 and 17 are brought out through terminals 45 which are insulated from bases 23 and 44. Terminals 45 are made of stiff wire or metal rods and have sufficient mechanical strength to maintain bases 23 and 44 in properly spaced relationship.

Figure 5:
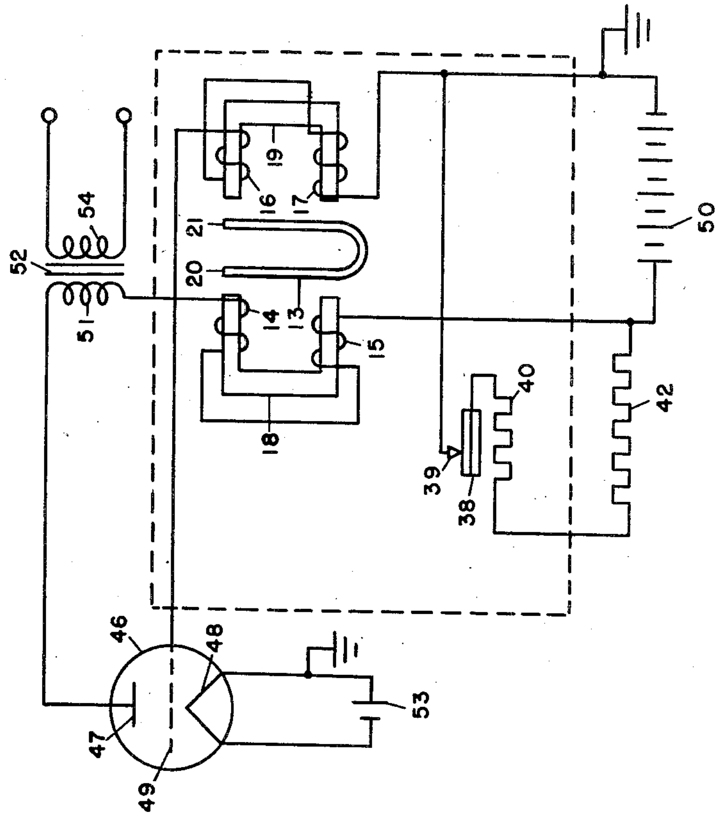
Figure 5 is a diagrammatic illustration of the electric circuits of the device shown in Figures 1 to 5.

Referring now to Figure 5, a conventional electric circuit for driving the tuning fork 13 is shown. It includes an electric discharge means 46 which comprises an anode 47, a cathode 48 and a control grid 49. Electric discharge means 46 may be of any of the several types well known in the art although I prefer to employ an electric discharge means of the high vacuum type. Driving coils 14 and 15 are disposed on core 18, which may be a permanent magnet. Coils 14 and 15 are energized from any suitable source of current, such as battery 50, through the primary winding 51 of an output transformer 52 and the anode-cathode circuit of electric discharge means 52. Pick-up coils 16 and 17 are disposed on core 19, which may be a permanent magnet. Coils 16 and 17 are connected across control grid 49 and cathode 48. Cathode 48 is connected to a source of current, such as battery 53, which maintains cathode 48 at its proper operating temperature.

The mode of operation of the circuit shown in Figure 5 will be well understood by those skilled in the art. Briefly, at the point in the cycle of vibration of tines 20 and 21 at which they are at their extreme outward displacement, the velocity of tines 20 and 21 is zero and no voltage is being induced in pick-up coils 16 and 17. The attraction of the magnetized core 18 for the tine 20 is substantially the same as when tine 20 is at rest. Since tines 20 and 21 are now displaced from their normal rest positions, the elastic forces of tines 20 and 21 now accelerate them inwardly. The resultant movement of tines 20 and 21 causes a voltage to be induced of pick-up coils 16 and 17 proportional to the velocity of tines 20 and 21 and of such polarity that a negative potential is impressed on control grid 49 of electric discharge means 46. Electric discharge means 46 therefore transmits less current to driving coils 14 and 15 decreasing the attraction of core 11 for tine 20. The negative potential impressed on control grid 49 is of maximum value as tines 20 and 21 pass their normal rest positions and decreases to zero when tines 20 and 21 reach their extreme inward displacement. At this time the elastic forces of tines 20 and 21 accelerate them outwardly, the resulting movement inducing a voltage in pick-up coils 16 and 17 which is again proportional to the velocity of tines 20 and 21 but is of such polarity that a positive potential is impressed on control grid 49 causing electric discharge means 46 to transmit more current to driving coils 14 and 15 and causing driving coils 14 and 15 to exert a greater attraction on tine 20. This positive potential impressed on control grid 49 is of maximum value as tines 20 and 21 pass their normal positions and decreases to zero when tines 20 and 21 reach their maximum outward displacement. At this point the cycle repeats. As a result of the cyclic process described above the pulsations of current transmitted to driving coils 12 and 13 will cause pulsations in the attraction of core 18 for tine 20 which will cause sustained vibration of tuning fork 13 if power dissipated by tuning fork 13 is equal to or less than the power delivered to it by driving coils 14 and 15. The pulsations of current in primary winding 51 induce an alternating current in secondary winding 54 of transformer 52 which has the same frequency as the frequency of vibration of tuning fork 13.

Booster heating coil 40 and main heating coil 42 are connected in series across battery 50 when the bimetallic strip 38 contacts terminal 39. Booster heating coil 40 is employed to maintain as small as possible the range over which the temperature within inner container cycles. Bimetallic strip 38 must be raised to a predetermined high temperature before it breaks contact with terminal 39 and de-energizes coils 40 and 42. When the temperature falls below a predetermined low temperature, strip 38 again contacts terminal 39 and current flows through coils 40 and 42 heating bimetallic strip 38 and the structures within container 41. Booster coil 40 is wound directly on thermostat 33, to maintain bimetallic strip 38 at substantially the same temperature as that of the other structures within container 41.

Important advantages of tuning fork structure of my invention are its simplicity of construction, ease of manufacture, and the ready adjustability of the frequency of vibration of the tuning fork.

While I have shown and described a preferred embodiment of my invention, it will be obvious to those skilled in the art that various changes and modifications can be made without departing from my invention and I, therefore, aim in the appended claims to cover all such changes and modifications as fall within the true spirit and scope of my invention.

What I claim as new and desire to secure by Letters Patent of the United States is:

1. In combination: a substantially U-shaped supporting means comprising a pair of U-shaped supporting members, each of said supporting members having a pair of parallel portions and a bight portion perpendicular to and connecting said parallel portions; a tuning fork disposed between and parallel to said parallel portions; driving means and pick-up means for said tuning fork mounted on said parallel portions; and means conected to said parallel portions of said supporting means for varying the distance between said parallel portions to vary the distance between said tuning fork and said driving means and pick-up means.

2. In combination: a pair of substantially U-shaped supporting members, each of said supporting members having a pair of parallel portions and a bight portion connecting said parallel portions; a tuning fork, said tuning fork having a base rigidly held by said bight portions; driving means rigidly secured to said supporting members on one side of said tuning fork; pick-up means rigidly secured to said supporting members on the other side of said tuning fork; a pair of flexible means, one of said flexible means connecting the parallel portions of one of said supporting members, the other of said flexible means connecting the parallel portions of the other of said supporting members, said pair of flexible means being disposed in substantially parallel relationship; and adjustable means interconnecting said pair of flexible means for varying the positions of said driving and pick-up means from said tuning fork.

3. In combination: a U-shaped supporting means having a connecting portion and a pair of parallel end portions extending perpendicularly from said connecting portion; a tuning fork rigidly secured to said connecting portion extending between and parallel to said end portions; a driving means and a pick-up means rigidly secured to said parallel end portions adjacent said tuning fork; and adjustable means for drawing said parallel end portions toward each other to vary the distance between said fork and said driving and pick-up means.

4. In combination: a U-shaped supporting means having a connecting portion and a pair of parallel end portions extending perpendicularly from said connecting portion; a tuning fork rigidly secured to said connecting portion extending between and parallel to said end portions; a driving means and a pick-up means rigidly secured to said parallel end portions adjacent said tuning fork; a pair of connecting members secured to said parallel end portions; and an adjustable tensioning means connecting said connecting members for drawing said parallel end portions toward each other.

5. A tuning fork mounting means comprising: a supporting means having a connecting portion and a pair of parallel end portions extending perpendicularly from said connecting portion; a tuning fork disposed between and parallel to said parallel end portions; a driving means and pick-up means mounted on said parallel end portions; and means connecting said parallel end portions for varying the distance between said parallel end portions whereby the frequency of vibration of said tuning fork may be varied.

6. In combination: a pair of substantially U-shaped supporting members, each of said supporting members having a pair of parallel portions and a bight portion connecting said parallel portions; a tuning fork, said tuning fork having a base rigidly held by said bight portions; driving means rigidly secured to said supporting members on one side of said tuning fork; pick-up means rigidly secured to said supporting members on the other side of said tuning fork; and means operatively associated with said parallel portions of said supporting members for simultaneously varying the distance of said driving and pick-up means from said tuning fork.

7. In combination: a substantially U-shaped supporting means comprising a pair of supporting members, each of said supporting members having a pair of parallel portions and a bight portion connecting said parallel portions; a tuning fork disposed between and parallel to said parallel portions; driving means and pick-up means for said tuning fork mounted on said parallel portions; a pair of flexible means, one of said flexible means connecting the parallel portions of one of said supporting members, the other of said flexible means connecting the parallel portions of the other of said supporting members, said pair of flexible means being disposed in spaced substantially parallel relationship; and means for adjustably drawing said flexible means toward each other, whereby the distance between said parallel portions is varied to vary the frequency of said tuning fork.

8. In combination: a U-shaped supporting means having a connecting portion and a pair of parallel end portions extending perpendicularly from said connecting portion; a tuning fork rigidly secured to said connecting portion extending between and parallel to said end portions; a driving means and a pick-up means rigidly secured to said parallel end portions adjacent said tuning fork; adjustable means for varying the distance between said parallel end portions; a thermostat mounted on said U-shaped supporting means; a container disposed about said U-shaped supporting means; and a heating coil disposed about said container, said thermostat being connecting to said heating coil to maintain the temperature within said container substantially constant.

JOSEPH J. MURRAY, Jr.

REFERENCES CITED

The following references are of record in the file of this patent:

UNITED STATES PATENTS

| Number | Name | Date |
|---|---|---|
| 1,560,056 | Horton | Nov. 3, 1925 |
| 1,872,379 | Wolf | Aug. 16, 1932 |
| 1,937,583 | Norman | Dec. 5, 1933 |
| 2,034,787 | William | Mar. 24, 1936 |
| 2,222,688 | Rumpel | Nov. 26, 1940 |